US012642010B2

(12) United States Patent
Aseev et al.

(10) Patent No.: US 12,642,010 B2
(45) Date of Patent: May 26, 2026

(54) FABRICATION METHOD

(71) Applicant: Microsoft Technology Licensing, LLC, Redmond, WA (US)

(72) Inventors: Pavel Aseev, Delft (NL); Philippe Caroff-Gaonac'h, Delft (NL); Leonardus Petrus Kouwenhoven, The Hague (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 1115 days.

(21) Appl. No.: 17/753,581

(22) PCT Filed: Sep. 10, 2019

(86) PCT No.: PCT/EP2019/074049
§ 371 (c)(1),
(2) Date: Mar. 8, 2022

(87) PCT Pub. No.: WO2021/047754
PCT Pub. Date: Mar. 18, 2021

(65) Prior Publication Data
US 2024/0107897 A1 Mar. 28, 2024

(51) Int. Cl.
*H10N 60/01* (2023.01)
*C30B 25/04* (2006.01)
(Continued)

(52) U.S. Cl.
CPC ............. *H10N 60/01* (2023.02); *C30B 25/04* (2013.01); *C30B 29/40* (2013.01); *C30B 29/60* (2013.01); *H10N 69/00* (2023.02)

(58) Field of Classification Search
CPC .................................................... H10N 60/01
See application file for complete search history.

(56) References Cited

U.S. PATENT DOCUMENTS 5,094,974 A * 3/1992 Grunthaner ....... H01L 21/02395
257/E21.123
6,255,182 B1 7/2001 Wieczorek
(Continued)

FOREIGN PATENT DOCUMENTS

CN 1193808 A 9/1998
CN 102842662 A 12/2012
(Continued)

OTHER PUBLICATIONS

First Office Action Received for Chinese Application No. 201980100172.7, mailed on Oct. 17, 2024, 12 pages (English Translation Provided).
(Continued)

*Primary Examiner* — Paul A Wartalowicz

(74) *Attorney, Agent, or Firm* — Klarquist Sparkman, LLP

(57) ABSTRACT

A fabrication method comprising: forming a mask of an amorphous material over a crystalline surface of a substrate, the mask having a pattern of openings defining areas of an active region in which one or more components of one or more active devices are to be formed, the mask further defining a non-active region in which no active devices are to be formed; and forming a deposition material through the mask by an epitaxial growth process. The deposition material thus forms in the openings of the active region. The pattern of openings through the mask further comprises one or more reservoirs formed in the non-active region, each of the reservoirs being connected by the pattern of openings in the mask to at least one of the areas in the active region, and the deposition material forming in the reservoirs as part of the epitaxial growth.

16 Claims, 3 Drawing Sheets

(51) Int. Cl.

| | | |
|---|---|---|
| *C30B 29/40* | (2006.01) | |
| *C30B 29/60* | (2006.01) | |
| *H10N 69/00* | (2023.01) | |

(56) References Cited

U.S. PATENT DOCUMENTS

| | | | |
|---|---|---|---|
| 8,030,108 B1 | 10/2011 | Lee et al. | |
| 2006/0228850 A1 | 10/2006 | Tsai | |
| 2018/0122811 A1 | 5/2018 | Kim | |
| 2019/0371908 A1* | 12/2019 | Hutin | H10D 30/014 |
| 2020/0185497 A1* | 6/2020 | Posseme | H10D 62/814 |

FOREIGN PATENT DOCUMENTS

| | | |
|---|---|---|
| CN | 104952984 A | 9/2015 |
| CN | 109392313 A | 2/2019 |
| FR | 1359131 A | 4/1964 |
| WO | WO 2016/207415 | 12/2016 |
| WO | 2017153388 A1 | 9/2017 |
| WO | WO 2019/001753 | 1/2019 |
| WO | WO 2019/074557 | 4/2019 |

OTHER PUBLICATIONS

International Search Report and Written Opinion dated Jun. 9, 2020 from International Patent Application No. PCT/EP2019/074049, 12 pp.

"Notice of Allowance Issued in European Patent Application No. 19769096.9", Mailed Date: Sep. 28, 2023, 2 Pages.

"Notice of Allowance Issued in European Patent Application No. 19769096.9", Mailed Date: May 11, 2023, 7 Pages.

Notice of Allowance Received for Chinese Application No. 201980100172.7, mailed on Mar. 26, 2025, 08 pages (English Translation Provided).

* cited by examiner (i)                    (ii)                    (iii)

FABRICATION METHOD

CROSS REFERENCE TO RELATED APPLICATIONS

This is the U.S. National Stage of International Application No. PCT/EP2019/074049, filed Sep. 10, 2019, which was published in English under PCT Article 21(2), and which is incorporated herein by reference in its entirety.

BACKGROUND

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

Structures such as the semiconductor of a network of nanowires can be formed on a substrate by means of epitaxy. Epitaxy is a known deposition technique that comprises growing one crystalline material on another crystalline material, in this case the semiconductor. The first material acts as a seed crystal for the second material being grown on the first. The growth is performed selectively, such as by forming a patterned mask over a layer of the first material (e.g. a semiconductor substrate) and growing the deposited material (e.g. another semiconductor) in the regions left exposed by the masked. In this case the process can also be referred to as selective area growth (SAG). Example techniques for the epitaxial deposition itself include, for example, electron-beam physical vapour deposition, plasma-enhanced chemical vapour deposition, or atomic layer deposition, and molecular beam epitaxy.

As well as nanowires, epitaxy can also be used to grow other structures for use in quantum computing devices, spintronic devices and classical electronic devices.

SUMMARY

An issue with epitaxial growth processes such as SAG is that they have a tendency to form growth irregularities. It would be desirable to control the formation of such growth irregularities and thus increase the yield of the fabrication process.

The inventors have identified the following. There is an approximately equal probability per unit area of the growth irregularity first forming anywhere within a continuous section of the openings in the mask. However, once a growth irregularity has formed at one point within that continuous section, then another irregularity will tend not to form within that same section. The reason is believed to be that the irregularity forms around the point at which the growth first originates.

To exploit this phenomenon, the invention provides a fabrication method that includes one or more artificial "reservoirs" in a part of the mask covering a non-active region, i.e. a region where no active devices are formed. The reservoirs are connected, via the openings in the mask, to the pattern of openings defining one or more components of one or more devices in the active region. This increases the chance that growth will begin outside of the active region, and hence that the growth irregularity will form outside the active region. The total area of the reservoir(s) is preferably made larger than the total area of the openings in the active region to which the reservoir(s) is/are connected. Hence there is a higher chance that the growth will originate in one of the reservoirs, and hence that the growth irregularity will form in one of the reservoirs. The larger the reservoirs, the better the chance.

In an example application, the component(s) defined in the active region may comprise the semiconductor core(s) of one or more nanowires of a quantum device.

In embodiments, the material in the reservoirs may also be used for another purpose less sensitive to the presence of growth irregularities, such as forming a classical electrical contact with the nanowire. Alternatively the reservoirs could simply have no other function than as receptacles for the growth irregularities.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION OF EMBODIMENTS

In the case of epitaxial techniques such as selective area growth (SAG) by molecular beam epitaxy (MBE), there are specific growth modes which have a challenge of non-uniformity of growth randomly appearing inside the mask openings. For usual device sizes, there will only be one confined non-uniform region per device. The non-uniform region could have a detrimental effect on device performance if this occurs in the so called active region of the device. To mitigate this issue, it is disclosed herein to modify the mask design with the addition of reservoirs to a non-active part of the device to reduce the probability of growth non-uniformity within active region of the device. Growth non-uniformity has a higher chance of appearing inside the reservoirs rather than in the active region of the device (due to larger area of reservoirs). The disclosed techniques can thus increase the yield in the fabrication of device by epitaxial growth, such as to drastically improve the yield of nanoscale devices and/or devices with complex shapes.

Moreover, the shape of the reservoirs can be arranged to bring additional functionality, e.g. to form electrical contacts or Landauer transport reservoirs. In the case where the reservoirs are used to form electrical contacts, an additional advantage of the reservoirs is that they can reduce contact resistance with the deposited semiconductor due to increased contact area.

Figure 1:
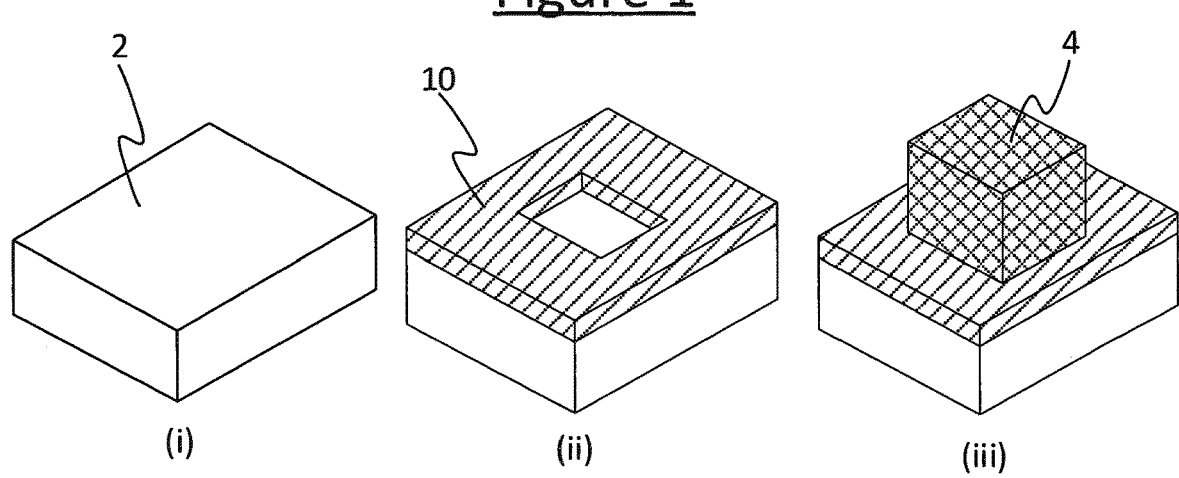
FIGS. 1(*i*) to (*iii*) schematically illustrate a method of depositing a material.

FIG. 1 schematically illustrates a process of depositing a deposition material 4 over a substrate 2. The process begins with a substrate 2 comprising at least a wafer. Though the terminology is not always used consistently in the art, for the present purposes the "wafer" will be taken herein to refer to the base layer, and the "substrate" will refer to the wafer and any additional layers which may have been added to the wafer up to that point in the fabrication process. Hence the substrate 2 shown as the starting point for the method of FIG. 1 may comprise just the wafer alone, or the wafer plus one or more previously-deposited layers formed over the wafer.

On another point of terminology, note that "over", "top" or such like as used herein do not necessarily mean with respect to gravity, but rather are to be understood in the sense of the side being worked, i.e. the side upon which the deposition is currently being performed (e.g. the material may be deposited in an upward, downward or sideways direction with respect to gravity, or indeed at any angle). In the case of deposition through a mask 10, a layer formed over the substrate 4 means a layer between the substrate 10 and the source of the deposition material. A reciprocal interpretation should also be given to terms such as "beneath", "underlying", or such like.

At step (i), the method starts with the substrate 2 comprising at least a wafer. Although not shown in FIG. 1, there may also be complex layers, such as a pseudo metamorphic buffer stack, formed on or over the wafer. Such stacks are known in the art and comprise layers of different materials with material properties which gradually differ from those of the wafer to those of a material to be grown on top of the wafer. This enables a better matching of crystalline properties.

At step (ii), a patterned mask 10 is formed over the top surface of the substrate 2. The mask comprises a pattern of openings, at least some of which are continuous with one another. These openings define different components or elements of the device that is to be fabricated.

The amorphous mask 10 can be patterned in any suitable manner. For example, in embodiments the mask material may be initially formed over the whole top surface of the substrate 2 in a uniform, continuous layer (e.g. by chemical deposition) and then subsequently patterned by selectively removing the mask material from the desired areas, e.g. by etching or lithography. As another example, the mask material 10 can be selectively deposited on the substrate 2 with a stencil used to prevent deposition of the mask material in the desired regions. As another alternative, the patterned mask 10 could be formed elsewhere and transferred mechanically to the substrate 2.

The mask 10 is formed from an amorphous material, i.e. without a regular crystalline structure. In embodiments it is preferably also a dielectric or other insulator. For example, the mask material could be an oxide such as silicon oxide (SiOx). Amorphous materials cannot sustain epitaxial growth. That is, they inhibit the growth in areas where they are deposited on the substrate, while the growth can proceed on the crystalline substrate 2 where the mask is open.

At least the upper surface of the substrate 2 is formed from a crystalline material. For instance, the substrate 2 may be a semiconductor, e.g. any III-V semiconductor such as indium phosphide (InP), gallium antimonide (GaSb) or gallium arsenide (GaAs).

At step (iii), the deposition material 4 is deposited onto the upper surface of the substrate 2 through the mask 10 by means of an epitaxial growth technique. Thus the deposition material 4 is grown in the openings of the mask 10, on the exposed portions of the substrate 2. The deposition material 4 is also a crystalline. For instance this may again be a semiconductor, e.g. any Ill-V semiconductor such as indium arsenide (InAs), gallium antimonide (GaSb) or gallium arsenide (GaAs). Preferably it is a different material than the surface of the substrate 2 that is being worked.

The growth method is an epitaxial growth method such as selective area growth (SAG). Epitaxy refers to a technique whereby a second crystal is grown on a first crystal using the first as a seed crystal. SAG refers to localized growth of semiconductor in exposed regions of the substrate, with growth conditions selected (or "tuned") to prevent such growth on the amorphous mask itself. This can be based on Chemical Beam Epitaxy (CBE), Molecular Beam Epitaxy (MBE), or Metal-Organic Chemical Vapour Deposition (MOCVD), for example. In the context of semiconductors, SAG may refer to a class of epitaxial semiconductor growth (and is also referred to as selective area epitaxy), in which a patterned amorphous mask is used to define the intended structure of the semiconductor material to be grown (a form of lithography). In SAG, the process is tuned such that semiconductor growth occurs only on regions of the substrate that are not covered by the amorphous mask 10, and not on the amorphous mask itself. This is different from other deposition processes, such as uniform deposition (epitaxial or otherwise) when no mask is used in which material is uniformly deposited across a surface irrespective of its material composition. SAG may be conducted in a high or ultra-high vacuum, and involves tuning to achieve the desired selective growth.

In embodiments, the growth method used to deposit the deposition material 4 (e.g. semiconductor) in the openings of the mask 10 is a particular type of selective area growth called "metal sowed" SAG. In this particular method, in order to form a compound semiconductor such as InSb for example, one uses following sequence: 1) selectively deposit one element of the alloy (e.g. In), and 2) supply a second element of the alloy (e.g. Sb) to convert deposited first element into the compound (e.g. InSb). Doing so in this non-concomitant fashion allows one to use different conditions for each of the elements, which otherwise cannot be selectively deposited if done concomitantly. This enables growth of alloys for which selectivity conditions are not overlapping between the elements. But the downside of this process is increased probability of formation of abovementioned irregularities. The present disclosure provides a way to address this issue.

In an optional additional step (not shown) one or more uniform or patterned layers of a further material such as a conducting material (e.g. superconducting material) may be grown over at least part of the nanowire network. For instance a patterned layer of the conducting or superconducting material may be grown using a particle beam. Herein, a superconducting material means a material that exhibits superconducting properties at least under certain conditions. An example of such a material is aluminium (Al). Alternatively the superconductor material 112 could be niobium (Nb), titanium nitride (TiN), or any other s-wave superconductor. In embodiments, the superconductor growth may also be performed by epitaxial growth, or by another means.

Figure 2:
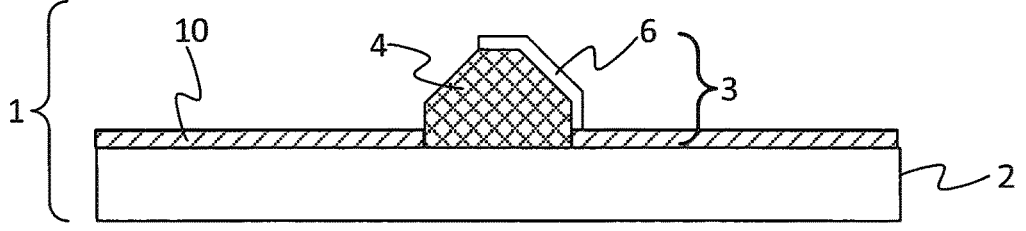
FIG. 2 is a schematic side-on diagram of a nanowire, FIGS. 3(*a*-(*b*) is a top-down image of an example structure formed by epitaxial growth, and FIGS. 4(*a*)-(*b*) are some further top-down images of structures formed by epitaxial growth.

As shown in FIG. 2, in an example application the described process may be used to form a structure of one or more semiconductor-superconductor nanowires. FIG. 2 schematically illustrates a side-on view of one example nanowire 3, but it will be appreciated that a network of two or more such nanowires may be formed. The (or each) nanowire 3 comprises a core in the form of a length of semiconductor 4 (running into/out of the page in FIG. 2), coated at least partially by a coating of superconducting material 6. The semiconductor core 4 may be formed by means of the epitaxial growth techniques disclosed herein. In embodiments the semiconductor 4 of the nanowire 3 may comprise InAs, InSb or GaAs, and the upper surface of the substrate 2 may comprise InP, GaSb or GaAs. The mask may comprise SiOx. The superconductor 6 may comprise Al, Nb or TiN. The superconductor 6 may be formed by the epitaxial growth techniques disclose herein, or any known conventional deposition technique such as conventional SAG or other epitaxial growth.

At least part of the superconductor layer 6 is deposited on top of the semiconductor 4 of the nanowire 3 such that this part of the superconductor 6 is in direct contact with the semiconductor 4 of the nanowire 3.

In one possible technique, the beam depositing the superconducting material 6 can be angled in substantially parallel to the z-direction (the direction perpendicular to the plane of the substrate) such that essentially all of the exposed surfaces of the amorphous mask 10 and the semiconductor material 4 are covered by the superconducting. However, in another example as illustrated, the particle beam is incident with a non-zero angle of incidence relative to the z-direction. As a consequence of this non-zero deposition angle, the semiconductor 4 core of the nanowire 3 is only partially coated by the superconductor layer 6, leaving it uncoated by the superconductor 6 on one side. This leaves a "side gate" area for gating the nanowire with an electrostatic potential. Alternatively gating could be enabled by other means, such as leaving an exposed window in the horizontal pattern of the superconductor 6.

Note also that the same material as used for the superconductor 6 of the nanowires 3, deposited in the same deposition step, may optionally also be used to form other elements such as classical electrical contacts. And/or, one or more further steps (not shown) may be used to form other elements such as classical electrical contacts and vias for connecting the nanowire 3 to other parts of the overall device or the external world.

The semiconductor and superconductor growth phases can each be conducted in a vacuum chamber, preferably in the same chamber or chambers connected by a vacuum tunnel, without breaking vacuum between phases. These phases can be carried out under high vacuum or ultra-high vacuum conditions, and those vacuum conditions may be maintained between phases.

In embodiments the substrate 2, mask 10 and nanowire network 3 can all be incorporated together in the endproduct, such as a quantum circuit or quantum computer, without the need to transfer the nanowires 3 from the substrate 2 or removing the mask 10. Applications of the disclosed technology include topologically protected quantum computing circuits that comprise networks of nanowires formed using such mixed semiconductor and superconductor regions.

As noted, nanowires 3 can be used to produce Majorana-based topological qubits, which utilize the formation of superconducting islands, some parts of which are topological (T) and some parts of which are non-topological (e.g., conventional s-wave (S)). SAG techniques can provide a high degree of control over the shape of the produced devices, and thus are useful in producing the components used in scalable topological quantum computation. In example embodiments, one or more Majorana zero modes, MZM, may be induced in at least one nanowire of the nanowire network by cooling the superconductor 6 to a superconducting temperature, applying a magnetic field to the device, and typically also gating the nanowires 3 with an electrostatic potential. This in itself is known in the art.

However, there can be a problem with the fabrication of such devices. This is shown by way of example in FIGS. 3(a) and 3(b).

Figure 3A:
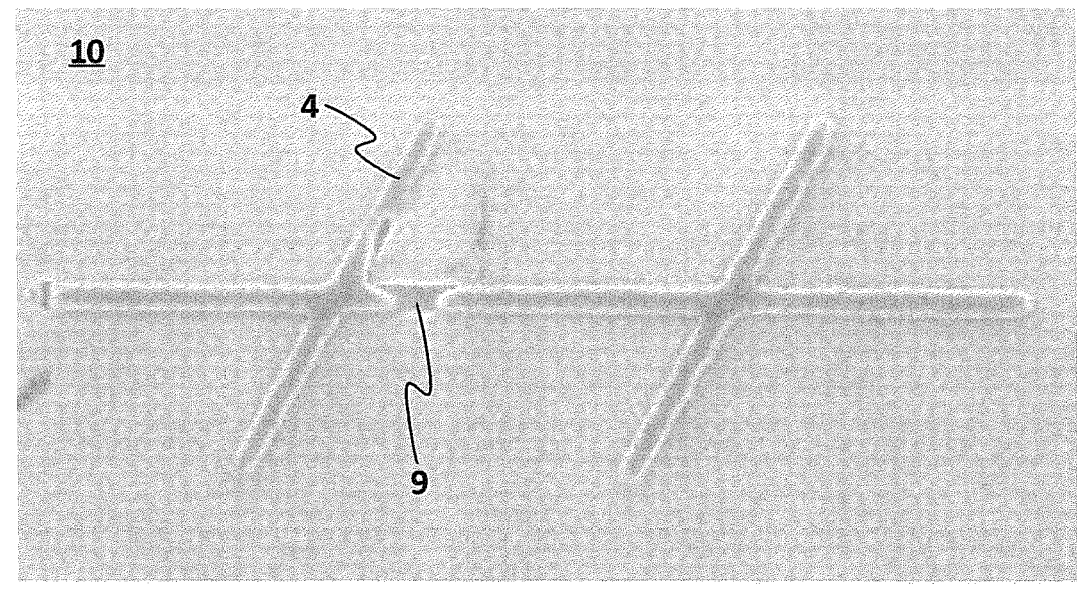

FIG. 3(a) shows a top-down scanning electron microscopy (SEM) image of an example nanowire network at the stage following deposition of the semiconductor 4 by SAG into the openings in the mask 10, but before coating with the superconductor 6.

Figure 3B:
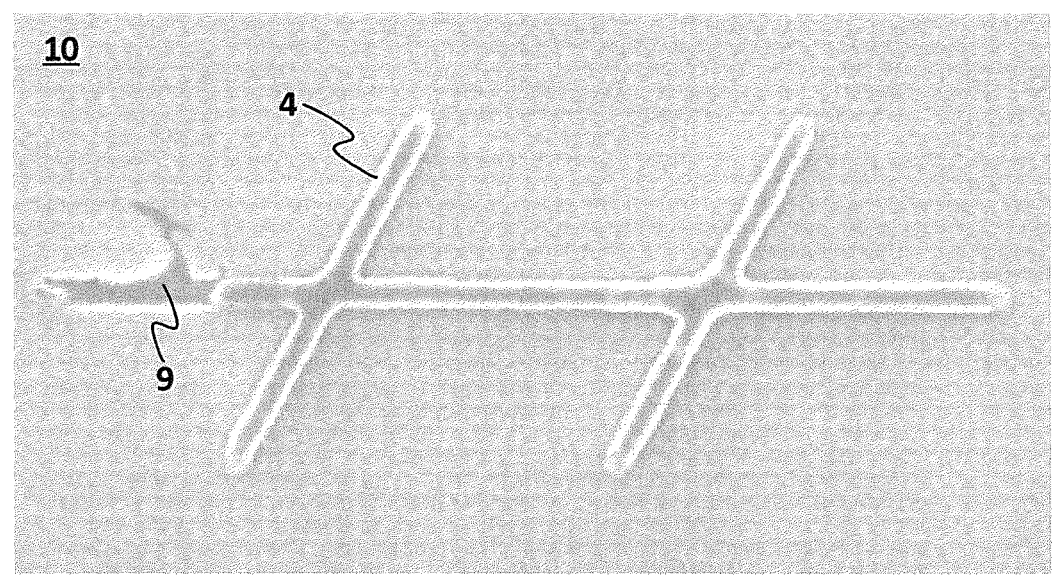

As can be seen in the image, the SAG process has a tendency to form growth irregularities 9. Within a given continuous structure defined by the openings in the mask 10, the growth irregularity 9 can occur randomly anywhere within the overall area defined by the openings. If this irregularity 9 falls within an active, functional region of the device being fabricated, then that device may not function properly or at all (e.g. in this case, will not be usable as a nanowire network for forming MZMs and operating as a qubit). Other, similar devices may be formed on the same substrate 2 (same chip) and may still be usable, but nonetheless the spoiled device will contribute towards a reduced yield of useful devices on the chip. Another example image of a growth irregularity 9 is shown in FIG. 3(b).

Figure 4A:
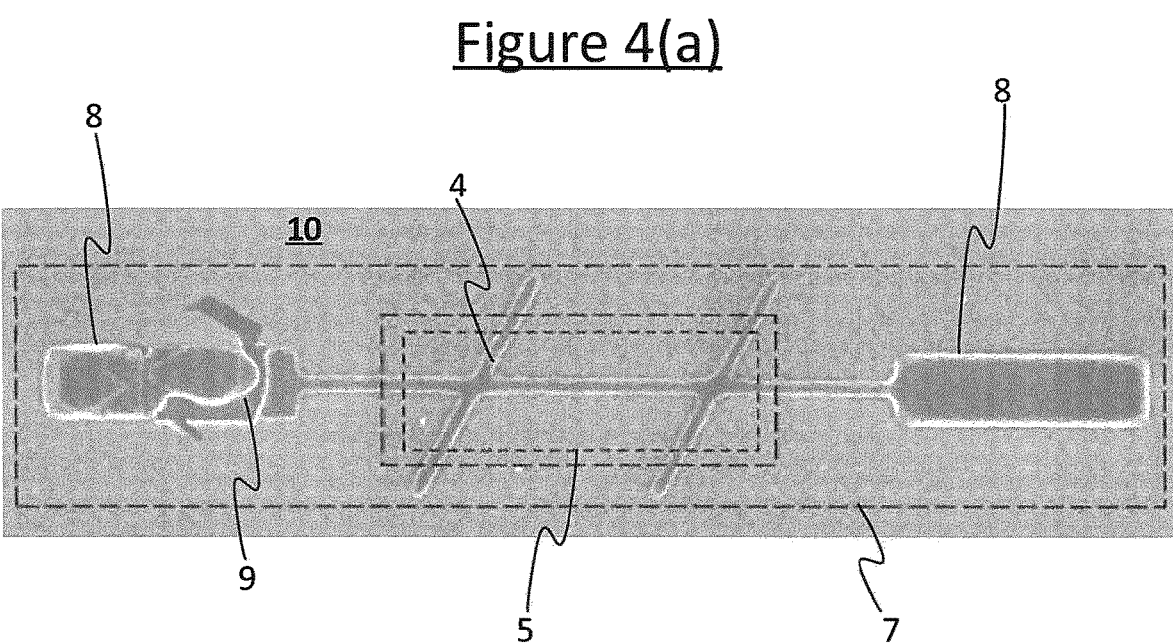

An image of an example structure designed to address this issue, in accordance with embodiments of the present disclosure, is shown in FIG. 4(a).

Not all regions of the deposited semiconductor 4 play a role in generating the quantum effects that are manipulated for the purpose of quantum computing, such as to form a qubit. The areas where such quantum effects occur have the highest requirements for crystal quality. These areas form an active region 5 of the device. In other words, the quantum effects involved in the quantum computing device are typically confined to certain areas within a nanowire network, e.g. at certain junctions of the network. The active (or operative) region 5 of the nanowire network refers to any region where these effects are arranged to occur for the purpose of functioning as a quantum computing device. Note that not the entire body of the nanowire needs to be used for the active device (where the active device comprises part(s) of the nanowire in which MZMs are to be formed). In contrast, the areas surrounding the active region 5 of the device form a non-active region 7. The non-active (non-operative) region 7 refers to a region where said effects are not expected to occur, or are not arranged to be used for quantum computing purposes. These regions may be completely non-functional, or could include components for providing a supporting functionality such as providing classical electrical contacts to the device.

To address the issue of the growth irregularities 9, it is disclosed herein to form one or more reservoirs 8 in the mask pattern in the non-active region 7 surrounding the device being fabricated. When the deposition material 4 (in this case the semiconductor) is deposited through the openings in the mask 10 by the epitaxial growth method, then it fills not only the areas defining the components of the device in the active region 5 (in this case the nanowire network) but also the areas of the one or more reservoirs 8. As mentioned, the epitaxial growth method may for instance be a selective area growth (SAG) process such as metal sowed SAG. For each of the one or more reservoirs 8, the opening in the mask 10 defining that opening is continuous with the opening(s) defining at least one component of the device in the active region 5. Preferably, the areas of the one or more reservoirs 8 and the areas of the one or more components of the one or more devices in the active region 5 are all continuous with one another, i.e. forming one overall continuous area defined by a continuous (i.e. joining) set of openings through the mask 10.

The disclosed structure has the effect of increasing the chance that the growth irregularity 9 forms in the non-active region 7 and reduces the chance that it forms in the active region 5. In epitaxial growth methods such as metal sowed SAG or other SAG techniques, then within any given continuous portion formed in the openings of the mask 10, the growth will typically begin at a single point of origin within that portion. Furthermore, the growth mechanism is such that the region where growth originates will often be irregular and cannot be used for active quantum devices such as nanowires (or at least it will be detrimental to device performance). I.e. the growth irregularity 9 occurs where growth begins. One cannot control where the growth begins per se. The point of origin, and therefore the growth irregularity 9, will occur at a random place within any given continuous expanse formed in the openings of the mask 10, with an approximately even probability per unit area. However, once growth has begun at that point, there will not typically be another growth irregularity 9 in the same continuous part of the mask pattern. Therefore by forming relatively large reservoirs 8 in the non-active region 7, it is possible to create a relatively higher chance that the growth irregularity 9 will form in one of the reservoirs and not in the areas of the device itself. Thus one can reduce the chance of a device being spoiled by a growth irregularity 9, and thus increase the yield of devices on a given substrate 2.

The larger the reservoirs, the better the chance that the growth irregularity forms there instead of in the active parts of the device. However, for another reason, in embodiments there may also be an upper limit placed on the size of reservoirs. This is dictated by the finite diffusion length of the atoms on the surface. If reservoir is too large, and growth originates inside it, then there is a chance that there will be no growth happening in the active region of the mask, because it is too far away from the origin of the growth (distance larger than the diffusion length of atoms). In a typical case this distance is no more than few tens of micrometres.

In the example illustrated in FIG. 4A, the device comprises a network of nanowires defined by a set of openings in the mask 10 which take the form of a set of intersecting channels or trenches in the mask, defining the areas where the semiconductor 4 will be grown in order to form the cores of the nanowires 3. The channels defining the nanowires are thus continuous with one another, since they intersect with one another. Further, the mask 10 includes two reservoirs 8, each disposed at a respective end of one of the channels, and being continuous with the respective end of the channel (i.e. the gap or aperture through the mask 10 is uninterrupted between the reservoir 8 and at least a respective one of the channels or other such openings defining at least one of the active components of the device, in this case one of the channels defining part of the nanowire network).

Figure 4B:
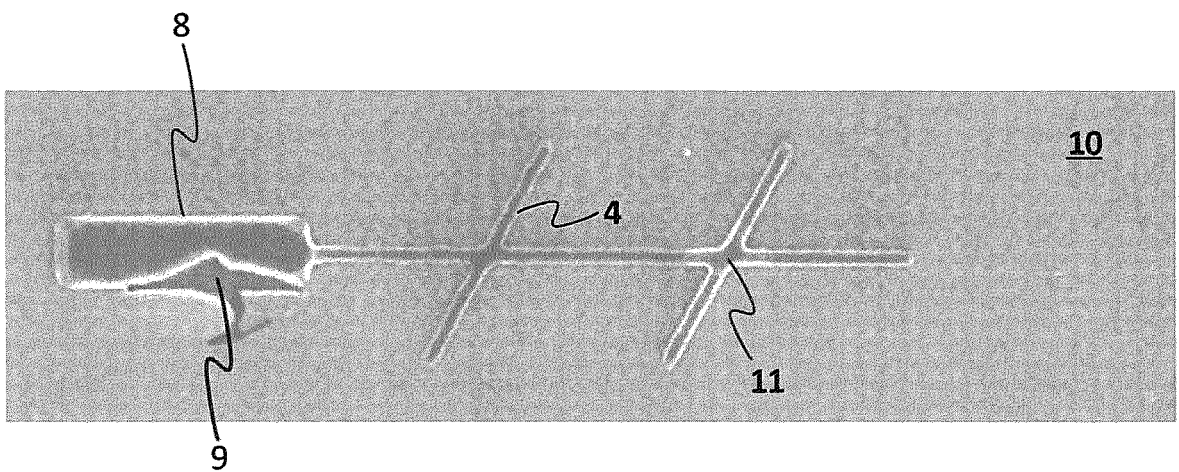

FIG. 4B illustrates another example. Here only one reservoir 8 is formed at the end of one channel or leg of the nanowire network. This can still reduce the chance of the growth irregularity 9 falling outside the active region 5, at least to some extent. However, as a secondary effect, it has been observed empirically by the inventors that an asymmetric set of reservoirs (e.g. only one reservoir) can lead to another (but less severe) form of irregularity in the structure of the formed shape. This is labelled with reference numeral 11 in FIG. 4B. This form of irregularity is not necessarily fatal to the device, but may have implications for quality or reliability. Therefore the asymmetric case, whilst not excluded, may be less preferred than the symmetric case such as shown in FIG. 4A.

In yet further embodiments, a reservoir 8 could even be formed on the ends of more than two of the legs of the nanowire network, even on every leg. So in the case of the nanowire network shown in FIGS. 4A and 4B, there could be up to six reservoirs 8.

In some embodiments the reservoirs 8 may be completely non-functional elements used solely for the purpose of containing the formation of the growth irregularities 9. However, in alternative embodiments, one or more of the reservoirs 8 could also be arranged to have one or more additional, supporting functions. For instance, the material formed in one or more of the reservoirs 8 could be used to form an electrical contact between the nanowire network and one or more other components on the same chip and/or with the exterior of the chip. If a metal contact is instead simply placed on the tip of one of the legs of the nanowire network, as in the conventional case, then the contact area will be very small. But if a metal contact is formed with the material 4 in one of the reservoirs 8, it will have a much higher contact area. This will reduce contact resistance between the metal contact and the semiconductor due to the increased contact area.

As another example, one or more of the reservoirs 8 may be used to create Landauer transport reservoirs. These are reservoirs which are significantly larger than nanowires and could have a specific cone shape. This allows one to use simplified equations for description of their electrical behaviour as well more straightforward interpretation of electrical results. Electrical conductors in the quantum regime are designed to have as little dissipation as possible. Electrical contacts, on the other hand, are required to bring the electronic bath to a thermal equilibrium such that the electro-chemical potential becomes well-defined. This equilibration requires dissipation. Thus, quantum conductors have opposite requirements compared to the electrical contacts that are needed to measure these conductors. This conflict was resolved by the concept of 'Landauer reservoirs'. For quantum conductors defined in SAG, Landauer reservoirs can be achieved by smoothly widening the dimensions from the narrow regions to reservoirs with dimensions longer than the inelastic mean free path, which is tens of microns at cryogenic temperatures.

It will be appreciated that the above embodiments have been described by way of example only.

For instance, the applicability of the disclosed techniques is not limited to forming nanowire networks for forming MZM-based quantum computing devices. More generally, the disclosed techniques can be used to reduce chance of growth irregularities forming in the active regions where any quantum or spintronic effects are to be exploited in other quantum computing or quantum sensing devices, or spintronic devices such as spintronic sensing or storage devices; or even to reduce the chance of growth irregularities in active regions where one or more active components of one or more classical electronic devices are to be formed. The disclosed techniques may be used in relation to any SAG or other epitaxial growth process, any of which may suffer from the issue of growth irregularities. The disclosed techniques may be used in relation to the deposition of any material capable of being deposited by epitaxy onto any crystalline surface that accepts epitaxial growth, through any amorphous mask that blocks or supresses epitaxial growth.

Hence more generally, according to one aspect disclosed herein, there is provided a fabrication method comprising: providing a substrate with a crystalline surface; forming a mask of an amorphous material over said surface of the substrate, the mask having a pattern of openings through the mask defining areas of an active region in which one or more components of one or more active devices are to be formed, the mask further defining a non-active region in which no active devices are to be formed; and forming a deposition material through the mask by an epitaxial growth process, the deposition material thus forming in the openings of the active region to form said one or more components of said one or more active devices; wherein the pattern of openings through the mask further comprises one or more reservoirs formed in the non-active region, each of the one or more reservoirs being connected by the pattern of openings in the mask to at least one of the areas in the active region, and the deposition material forming in the one or more reservoirs as part of said epitaxial growth.

In embodiments, a total of the areas of the active regions may be smaller in area than a total area of the one or more reservoirs.

In embodiments the epitaxial growth process may comprises a selective area growth, SAG, process.

In embodiments the SAG process may comprise a metal sowed SAG process.

In embodiments, the one or more devices may comprise one or more quantum devices arranged to use one or more quantum effects occurring in the active region in order to be operable as quantum devices.

In embodiments the one or more quantum devices may comprise one or more quantum computing devices arranged to use one or more quantum effects occurring in the active region in order to be operable as a quantum computing devices. For instance, in embodiments, the one or more quantum devices may comprise one or more qubits.

In other examples, the one or more devices may alternatively or additionally comprise one or more quantum sensing devices, one or more spintronic devices, and/or one or more active classical electronic devices.

In embodiments, the deposition material formed in at least one of the reservoirs may be arranged as an electrical contact to at least one of the active devices.

This gives an optional additional benefit in that it reduces the contact resistance. Alternatively the contacts could be formed directly with active device(s), the separately from the reservoirs. In that case one does not gain the reduced resistivity of the contact, but the reservoirs are still beneficial for the yield of such devices.

In embodiments, the deposition material may comprise a semiconductor. In some such embodiments the deposition material may comprises a III-V semiconductor. For instance the deposition material may comprise InAs, InSb or GaAs, or a combination thereof.

In embodiments the method may further comprise, after said epitaxial growth, forming at least one further, conducting material over the deposition material.

In embodiments the further material may comprise a metal. In some such embodiments the further material may comprise a superconducting material.

In embodiments, at least one of the active devices may take the form of a quantum computing device comprising at least one nanowire for forming Majorana Zero Modes, MZMs, in the nanowire; the deposition material comprising a semiconductor, and the one or more components formed from the deposition material comprising a semiconductor core of the at least one nanowire; and the method further comprising forming a coating of superconducting material over at least part of the semiconductor core.

In embodiments the superconducting material may comprise Al, Nb or TiN.

According to another aspect disclosed herein, there is provided a method of operating said at least one device, comprising cooling the device to a temperature at which the superconducting material exhibits superconductivity, applying a magnetic field to the device, and gating the at least one nanowire with an electrostatic potential, thereby inducing the MZMs.

In embodiments, at least one of the reservoirs may be arranged to form a Landauer transport reservoir when filled with the deposition material.

In embodiments the substrate may comprise a semiconductor. In some such embodiments the substrate may comprise a III-V semiconductor. For instance the substrate may comprise InP, GaS or GaSb, or a combination thereof.

Alternatively the substrate could comprise an insulator.

In embodiments the amorphous material of the mask may comprise a dielectric. For instance the dielectric may comprise SiOx.

According to another aspect disclosed herein, there may be provided a device comprising: a substrate with a crystalline surface; a mask of an amorphous material formed over said surface of the substrate, the mask having a pattern of openings through the mask defining areas of an active region in which one or more components of one or more active devices are formed, the mask further defining a non-active region in which no active devices are formed; and a deposition material formed in the openings of the mask of the active region, thereby forming said one or more components of said one or more active devices; wherein the pattern of openings through the mask further comprises one or more reservoirs formed in the non-active region, each of the one or more reservoirs being connected by the pattern of openings in the mask to at least one of the areas in the active region, and the deposition material also being formed in the one or more reservoirs.

In embodiments the device may further comprise features as would result from any of the fabrication steps disclosed herein.

Other variants or use cases of the disclosed techniques may become apparent to the person skilled in the art once given the disclosure herein. The scope of the disclosure is not limited by the described embodiments but only by the accompanying claims.

The invention claimed is:

1. A fabrication method comprising:

providing a substrate with a crystalline surface;

forming a mask of an amorphous material over said crystalline surface of the substrate, the mask having a pattern of openings through the mask defining areas of an active region in which one or more components of one or more active devices are to be formed, the mask further defining a non-active region in which no active devices are to be formed; and forming a semiconductor deposition material through the mask in a single epitaxial growth process, the semiconductor deposition material thus forming in the openings of the active region to form said one or more components of said one or more active devices, wherein the pattern of openings through the mask further comprises one or more reservoirs of the semiconductor deposition material formed in the non-active region, each of the one or more reservoirs of the semiconductor deposition material being connected by the pattern of openings in the mask to at least one of the areas in the active region, and the semiconductor deposition material forming in the one or more reservoirs of the semiconductor deposition material as part of said single epitaxial growth process.

2. The method of claim 1, wherein the single epitaxial growth process comprises a selective area growth (SAG) process.

3. The method of claim 2, wherein the SAG process comprises a metal sowed SAG process.

4. The method of claim 1, wherein the one or more active devices comprise one or more quantum devices arranged to use one or more quantum effects occurring in the active region in order to be operable as quantum devices.

5. The method of claim 1, wherein the semiconductor deposition material comprises a III-V semiconductor.

6. The method of claim 1, further comprising, after said single epitaxial growth process, forming at least one further conducting material over the semiconductor deposition material.

7. The method of claim 6, wherein the further conducting material comprises a metal.

8. The method of claim 6, wherein the further conducting material comprises a superconducting material.

9. The method of claim 1, wherein at least one of the active devices is a quantum computing device comprising at least one nanowire adapted to form Majorana Zero Modes in the nanowire; and the one or more components formed from the semiconductor deposition material comprising a semiconductor core of the at least one nanowire; and the method further comprising forming a coating of superconducting material over at least part of the semiconductor core.

10. The method of claim 1, wherein the substrate comprises a semiconductor.

11. The method of claim 10, wherein the substrate comprises a III-V semiconductor.

12. The method of claim 1, wherein the amorphous material of the mask comprises a dielectric.

13. A device comprising:

a substrate with a crystalline surface;

a mask of an amorphous material formed over said crystalline surface of the substrate, the mask having a pattern of openings through the mask defining areas of an active region in which one or more components of one or more active devices are formed, the mask further defining a non-active region in which no active devices are formed; and a semiconductor deposition material formed in the openings of the mask of the active region, thereby forming said one or more components of said one or more active devices and forming one or more semiconductor material reservoirs of the semiconductor deposition material in the non-active region, wherein each of the one or more semiconductor material reservoirs being is connected by the pattern of openings in the mask to at least one area of the active region.

14. The device of claim 13, wherein the one or more active devices comprise one or more quantum devices arranged to use one or more quantum effects occurring in the active region in order to be operable as quantum devices.

15. The device of claim 13, further comprising a conducting material or superconducting material situated over the semiconductor deposition material.

16. The device of claim 13, wherein at least one of the active devices is a quantum computing device comprising at least one nanowire adapted to form Majorana Zero Modes (MZMs) in the nanowire, and the one or more components formed from the semiconductor deposition material comprising a semiconductor core of the at least one nanowire; and further comprising a coating of superconducting material over at least part of the semiconductor core.

* * * * *